(12) United States Patent
Torok et al.

(10) Patent No.: US 7,911,830 B2
(45) Date of Patent: Mar. 22, 2011

(54) SCALABLE NONVOLATILE MEMORY

(75) Inventors: E. James Torok, Shoreview, MN (US); David Leslie Fleming, Minnetonka, MN (US); Edward Wuori, St. Paul, MN (US); Richard Spitzer, Berkeley, CA (US)

(73) Assignee: Integrated MagnetoElectronics, Berkeley, CA (US)

( * ) Notice: Subject to any disclaimer, the term of this patent is extended or adjusted under 35 U.S.C. 154(b) by 461 days.

(21) Appl. No.: 12/120,549

(22) Filed: May 14, 2008

(65) Prior Publication Data

US 2008/0285331 A1 Nov. 20, 2008

Related U.S. Application Data

(60) Provisional application No. 60/938,678, filed on May 17, 2007, provisional application No. 61/012,106, filed on Dec. 7, 2007, provisional application No. 60/943,513, filed on Jun. 12, 2007.

(51) Int. Cl.
*G11C 11/00* (2006.01)
(52) U.S. Cl. .................................... 365/158; 365/173
(58) Field of Classification Search .................. 365/158, 365/173
See application file for complete search history.

(56) References Cited

U.S. PATENT DOCUMENTS

| | | |
|---|---|---|
| 2,911,627 A | 11/1959 | Kilburn et al. |
| 3,972,786 A | 8/1976 | Ballard |
| 4,751,677 A | 6/1988 | Daughton et al. |
| 4,780,848 A | 10/1988 | Daughton et al. |
| 4,829,476 A | 5/1989 | Dupuis et al. |
| 4,980,859 A | 12/1990 | Guterman et al. |
| 5,051,695 A | 9/1991 | Hunter et al. |
| 5,173,873 A | 12/1992 | Wu et al. |
| 5,237,529 A | 8/1993 | Spitzer |
| 5,251,170 A | 10/1993 | Daughton et al. |
| 5,389,838 A | 2/1995 | Orengo |
| 5,432,734 A | 7/1995 | Kawano et al. |
| 5,442,508 A | 8/1995 | Smith |
| 5,477,143 A | 12/1995 | Wu |
| 5,477,482 A | 12/1995 | Prinz |
| 5,515,314 A | 5/1996 | Kouhei et al. |
| 5,561,368 A | 10/1996 | Dovek et al. |
| 5,563,839 A | 10/1996 | Herdt et al. |
| 5,565,236 A | 10/1996 | Gambino et al. |
| 5,585,986 A | 12/1996 | Parkin |
| 5,587,943 A | 12/1996 | Torok |
| 5,592,413 A | 1/1997 | Spitzer |
| 5,640,343 A | 6/1997 | Gallagher et al. |
| 5,640,754 A | 6/1997 | Lazzari et al. |
| 5,650,889 A | 7/1997 | Yamamoto et al. |

(Continued)

FOREIGN PATENT DOCUMENTS

EP 1 132 917 A2 3/2000

(Continued)

OTHER PUBLICATIONS

S. Chikazumi, *Physics of Magnetism*, Section 5.3, entitled "Ferrimagnetic Oxides and Compounds," John Wiley & Sons (1964).

(Continued)

*Primary Examiner* — Tuan T. Nguyen
(74) *Attorney, Agent, or Firm* — Weaver Austin Villeneuve & Sampson LLP

(57) ABSTRACT

Various magnetoresistive memory cells and architectures are included which enable nonvolatile memories having high information density.

15 Claims, 14 Drawing Sheets

U.S. PATENT DOCUMENTS

| | | | |
|---|---|---|---|
| 5,650,958 | A | 7/1997 | Gallagher et al. |
| 5,652,445 | A | 7/1997 | Johnson |
| 5,654,566 | A | 8/1997 | Johnson |
| 5,661,449 | A | 8/1997 | Araki et al. |
| 5,682,345 | A | 10/1997 | Roohparvar et al. |
| 5,686,837 | A | 11/1997 | Coehoorn et al. |
| 5,793,697 | A | 8/1998 | Scheuerlein |
| 5,852,574 | A | 12/1998 | Naji |
| 5,892,708 | A | 4/1999 | Pohm |
| 5,903,708 | A | 5/1999 | Kano et al. |
| 5,920,500 | A | 7/1999 | Tehrani et al. |
| 5,929,636 | A | 7/1999 | Torok |
| 5,969,978 | A | 10/1999 | Prinz |
| 5,986,962 | A | 11/1999 | Bertin et al. |
| 5,989,406 | A | 11/1999 | Beetz et al. |
| 6,031,273 | A | 2/2000 | Torok |
| 6,034,886 | A | 3/2000 | Chan et al. |
| 6,055,179 | A | 4/2000 | Koganci et al. |
| 6,104,632 | A | 8/2000 | Nishimura |
| 6,134,138 | A | 10/2000 | Lu et al. |
| 6,166,944 | A | 12/2000 | Ogino |
| 6,166,948 | A * | 12/2000 | Parkin et al. ............... 365/173 |
| 6,169,292 | B1 | 1/2001 | Yamazaki et al. |
| 6,278,594 | B1 | 8/2001 | Engel et al. |
| 6,292,336 | B1 | 9/2001 | Horng et al. |
| 6,353,552 | B2 | 3/2002 | Sample et al. |
| 6,469,927 | B2 | 10/2002 | Spitzer |
| 6,483,740 | B1 | 11/2002 | Spitzer |
| 6,493,257 | B1 | 12/2002 | Coughlin, Jr. et al. |
| 6,542,000 | B1 | 4/2003 | Black et al. |
| 6,573,713 | B2 | 6/2003 | Torok |
| 6,594,175 | B2 | 7/2003 | Torok |
| 6,859,063 | B2 | 2/2005 | Nuspi et al. |
| 6,917,088 | B2 * | 7/2005 | Takahashi et al. .......... 257/422 |
| 6,992,919 | B2 | 1/2006 | Andrei |
| 6,992,935 | B2 | 1/2006 | Ooishi |
| 7,259,062 | B2 * | 8/2007 | Lee ............................ 438/257 |
| 7,760,544 | B2 * | 7/2010 | Guo et al. ................... 365/158 |
| 2002/0024842 | A1 | 2/2002 | Spitzer et al. |
| 2002/0037595 | A1 | 3/2002 | Hosotani |
| 2002/0141232 | A1 | 10/2002 | Saito et al. |
| 2002/0180432 | A1 | 12/2002 | Torok et al. |
| 2003/0007398 | A1 * | 1/2003 | Daughton et al. .......... 365/200 |
| 2003/0214835 | A1 | 11/2003 | Nejad et al. |
| 2004/0010671 | A1 | 1/2004 | Sampsa et al. |
| 2004/0037109 | A1 | 2/2004 | Witcraft et al. |
| 2004/0061166 | A1 | 4/2004 | Kim |
| 2004/0075152 | A1 | 4/2004 | Barna |
| 2004/0183198 | A1 | 9/2004 | Andrei et al. |
| 2004/0196704 | A1 | 10/2004 | Andrei et al. |
| 2005/0018476 | A1 | 1/2005 | Kamijima et al. |
| 2005/0083743 | A1 | 4/2005 | Andrei et al. |

FOREIGN PATENT DOCUMENTS

| | | |
|---|---|---|
| WO | WO 96/25740 | 8/1996 |
| WO | WO 87/00959 | 2/1997 |
| WO | WO 97/41601 | 11/1997 |
| WO | WO 00/72324 | 11/2000 |
| WO | WO 02/05268 A2 | 1/2002 |
| WO | WO 02/05470 A2 | 1/2002 |
| WO | WO 02/078100 | 10/2002 |

OTHER PUBLICATIONS

Jaquelin K. Spong, et al., "Giant Magnetoresistive Spin Valve Bridge Sensor", Mar. 1996, IEEE Transactions on Magnetics, vol. 32, No. 2, pp. 366-371.

Mark Johnson, "The All-Metal Spin Transistor", May 1994, IEEE Spectrum, pp. 47-51.

Mark Johnson, "Bipolar Spin Switch", Apr. 16, 1996, Science, vol. 260, pp. 320-323.

J.M. Daughton, "Magnetoresistive Memory Technology," Jul. 28-Aug. 2, 1991, Int'l Workshop on Science and Technology of Thin Films for the 21st Century, vol. 216, pp. 162-168.

K.T.M. Ranmuthu et al., "New Low Current Memory Modes with Giant Magneto-Resistance Materials," Apr. 13, 1993, Digests of International Magnetics Conference, 2 pages.

J.L. Brown, "1-Mb Memory Chip Using Giant Magnetoresistive Memory Cells," Sep. 1994, IEEE Transactions on Components, Packaging, and Manufacturing Technology, Part A, vol. 17, No. 3, pp. 373-379.

Torok et al., "Measurement of the Easy-Axis and Hk Probability Density Functions for Thin Ferromagnetic Films Using the Longitudinal Permeability Hysteresis Loop", Journal of Applied Physics, 33, No. 10, Oct. 1962, pp. 3037-3041.

Lenssen, et al, "Expectations of MRAM in Comparison With Other Non-Volatile Memory Technologies", Phillips Research Laboratories, pp. 26-30.

Torok, et al, "Longitudinal Permeability in Thin Permalloy Films", Journal of Applied Physics, 34, No. 4, (Part 2), Apr. .1963, pp. 1064-1066.

Paul a. Packan, "Pushing the Limits", Sep. 24, 1999. science Mag, vol. 285, pp. 2079-2081.

Pratt, W.P., et al., "Perpendicular Giant Magnetoresistances of Ag/Co Multilayers", Physical Review Letters, 66 (23): 3060-3063 (Jun. 1991).

Parkin, S.S.P, et al., "Oscillatory Magnetic Exchange Coupling through Thin Copper Lavers", Physical Review Letters, 66(16): 2152-2155 (Apr. 1991).

Jones, K., "Texas Instruments Plans Large Expansion", The New York Times (Aug. 20, 1993).

Callaby, D.R. et al., Solid State Memory Study Final Report, Technical Report No. RE-0013, National Media Lab, St. Paul, MN (Feb. 1994).

National Media Laboratory Spring Review on Solid-State Memory Technologies, Proc. 1994 Spring Conference on Solid-State Memory Technologies, Pasadena, CA, (May 23-25, 1994), pp. 3-8, 97, 121, 123-133.

Harrison, R.W., "Laser Scanning Surface Profilomete", IBM Technical Disclosure Bullentin, 13(3): 789-790 (Aug. 1970).

Hylton, T.L., et al, "Giant Magnetoresistance at Low Fields in Discontinuous NiFe-Ag Multilayer Thin Films", Science, 261:1021-1024 (Aug. 1993).

Xiao, et al., "Giant Magnetoresistance in Nonmultilayer Magnetic Systems", Physical review Letters, vol. 68, No. 25, Jun. 22, 1992, pp. 3749-3752.

Zhang, S., "Theory of Giant Magnetoresistance in Magnetic Granular Films", Appl. Phys. Lett., 61(15): 1855-1857 (Oct. 1992).

Prinz, "Magnetoelectronics", www.sciencemag.org, Science, vol. 282, Nov. 27, 1998.

Spitzer and Torok, "A New Kind of Memory", The Industrial Physicist, Jun. 2000.

Grünberg, "Layered Magnetic Structures: History, Highlights, Applications", Physics Today, May 2001.

S. A. Wolf, "Spintronics: A Spin-Based Electronics Vision for the Future", www.sciencemag.org, Science, vol. 294, Nov. 16, 2001.

Sankar Das Sarnia, "Spintronics", American Scientist, vol. 89, Nov.-Dec. 2001.

Zorpette, "The Quest for the Spin Transistor", IEEE Spectrum, Dec. 2001.

Awschalom et al., "Spintronics", Scientific American, www.sciam.com, Jun. 2002.

K.-M.H. Lenssen, "Expectations of MRAM in Comparison with Other Non-Volatile Memory Technologies", Non-Volatile Memory Technology Symposium 2000, Nov. 15-16, 2000.

K.-M.H. Lenssen, "Magnetic Random Access Memory (MRAM) and its prospects", Non-Volatile Memory Technology Symposium 2001, Nov. 7-8 2001.

Barna et al., "The Transpinnor: An Active Spin-Based Device" Non-Volatile Memory Technology Symposium 2002, Nov. 4-6 2002. http://www.boulder.nist.gov/div816/2002/Magnetodynamics/.

H.W. Schumacher et al., "Current-induced precessional magnetization reversal", Applied Physics Letters, vol. 83, No. 11, pp. 2205-2207, Sep. 15, 2003.

Kabos et al., "Metastable States in Large Angle Magnetization Rotations". IEEE Transactions of Magnetics, vol. 36, No. 5, pp. 3050-3052, Sep. 2000.

Russek et al., "Time and Frequency Domain Measurements of Ferromagnetic Resonance in Small-Spin Valve", IEEE Transactions on Magnetics, vol., 36, No. 5, pp. 2560-2562, Sep. 2000.

Wang et al., *Fabrication and properties of spin dependent tunneling junctions with CoFeHfO as free layers*, Journal of Applied Physics, vol. 89, No. 11, Jun. 1, 2001.

Radu, Andrei, *Non-Volatile Memory Technology Symposium 2001*, Nov. 7-8, 2001.

X. Zhu et al., "A Novel Vertical MRAM Design".

Katti et al., *IEEE Circuits and Devices*, Mar. 2001, pp. 26-34.

Notification of Transmittal of the International Search Report dated Jul. 1, 2004 for PCT/US03/39262.

Notification Concerning Transmittal of International Preliminary Report on Patentability dated Oct. 16, 2008 for PCT/US2004/009418.

Notification of Transmittal of The International Search Report and the Written Opinion of the Interntional Searching Authority dated May 28, 2008 for PCT/US04/09418.

GB Examination Report dated Sep. 8, 2006 from GB0604381.4.

GB Examination Report dated Feb. 9, 2007 from GB0604381.4.

GB Examination Report dated May 8, 2007 from GB0604381.4.

Notification of Transmittal of the International Search Report and the Written Opinion of the International Searching Authority dated Feb. 22, 2005 for PCT/US2004/029317.

Notification Concerning Transmittal of International Preliminary Report on Patentability dated Mar. 23, 2006 for PCT/US2004/029317.

Notification of Transmittal of the International Search Report and the Written Opinion of the International Searching Authority dated Oct. 15, 2008 for PCT/US2008/063781.

* cited by examiner (a)

(b)

*(a)*

*(b)*

SCALABLE NONVOLATILE MEMORY

RELATED APPLICATION DATA

The present application claims priority under 35 U.S.C. 119(e) to U.S. Provisional Patent Application No. 60/938,678 for INHERENTLY RADHARD NONVOLATILE MEMORY filed May 17, 2007, U.S. Provisional Patent Application No. 61/012,106 for INHERENTLY RADHARD NONVOLATILE MEMORY filed Dec. 7, 2007, and U.S. Provisional Patent Application No. 60/943,513 for MAGNETORESISTIVE MEMORIES filed Jun. 12, 2007. The entire disclosure of each of these applications is incorporated herein by reference for all purposes.

BACKGROUND OF THE INVENTION

The present invention relates to nonvolatile memories and, in particular, to memories based on magnetoresistance.

Conventional nonvolatile memories—semiconductor as well as magnetic RAM (MRAM)—require shielding to protect against radiation. Conventional MRAM architectures provide nonvolatility by using magnetic storage elements, but employ CMOS transistors to address individual memory cells, thereby incorporating vulnerability to radiation damage into the system.

In recent years, the MRAM industry has largely focused on developing and commercializing nonvolatile memories based on magnetic tunnel junction (MTJ) structures. Both conventional MTJ memories as well as the more recently developed "toggle" MTJ memories have drawbacks which present obstacles to achieving the kind of density considered acceptable for commercialization. First, the minimum cell size for MTJ memories is significantly larger than the CMOS processing linewidth because of the complexity of the cell design and the interference of closely spaced cells.

Second, the overlap between the switching-field distributions of full-selected and half-selected cells in MTJ designs result in unacceptably high write error rates as the distance between cells shrinks, which is likely due to the demagnetizing fields from adjacent cells. Finally, most MTJ designs also suffer from a problem known as "magnetization creep" in which the cells become demagnetized over time so their information contents are lost.

SUMMARY OF THE INVENTION

According to various embodiments of the invention, memory cells and architectures based on magnetoresistance, and methods of making the same are provided. According to a particular class of embodiments, memories including one or more memory cells (and electronic systems incorporating such memories) are enabled in which each memory cell includes a first multilayer thin-film storage element exhibiting magnetoresistance. A first signal line is disposed above the first thin-film storage element and electrically isolated therefrom. A second signal line is disposed above the first signal line. The second signal line is electrically isolated from both the first thin-film storage element and the first signal line. At least one non-conductive keeper element is in direct contact with the first thin-film storage element. The first thin-film storage element and the keeper element form at least a portion of a fully-closed-flux structure. According to various subsets of embodiments, each first thin-film storage element may be one or more of a GMR element, an MTJ element, a CIP element, or a CPP element. According to another subset of embodiments, the first signal line and the second signal line in each memory cell are configured such that current directions associated with each are parallel.

According to another class of embodiments, memories (and electronic systems incorporating such memories) are enabled in which each memory cell in an array includes a magnetic tunnel junction (MTJ) storage element having first and second magnetic layers separated by an insulator. The first magnetic layers of the memory cells in each row of the array are connected in series to form a first sense line, and the second magnetic layers of the memory cells in each row of the array are connected in series to form a second sense line.

According to yet another class of embodiments, memories, electronic systems incorporating such memories, and methods of making such memories are enabled in which each memory cell includes a multilayer thin-film storage element exhibiting magnetoresistance. The storage element is characterized by a horizontal width and a vertical thickness. The vertical thickness of the storage element is controlled with reference to the horizontal width of the storage element such that a volume of the storage element is sufficient to ensure thermal stability of a magnetization state of the storage element for a specified period of time.

A further understanding of the nature and advantages of the present invention may be realized by reference to the remaining portions of the specification and the drawings.

DETAILED DESCRIPTION OF SPECIFIC EMBODIMENTS

Figure 1:
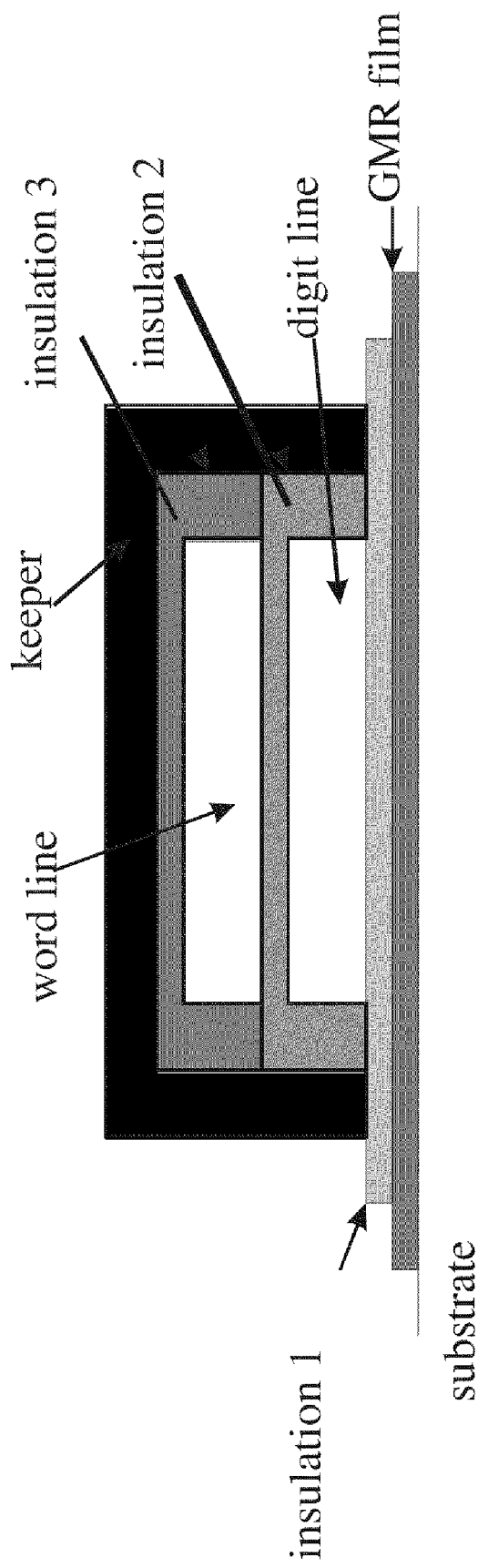
FIG. 1 is a simplified cross-section of a memory cell for use with embodiments of the invention.

Reference will now be made in detail to specific embodiments of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the following description, specific details are set forth in order to provide a thorough understanding of the present invention. The present invention may be practiced without some or all of these specific details. In addition, well known features may not have been described in detail to avoid unnecessarily obscuring the invention.

According to various embodiments of the invention, non-volatile memories based on various magnetoresistive mechanisms are enabled. Some embodiments described herein address various obstacles to miniaturization to enable magnetoresistive memories on scales not previously possible with conventional techniques. According to a particular class of embodiments, memory cells and architectures are implemented using memory cell designs having fully-closed-flux structures for which the write-current density is largely invariant with lithography linewidth, i.e., write current shrinks in proportion to linewidth. It should be noted that representations of memory cell and array configurations provided in the accompanying figures are simplified and not necessarily to scale in order to clearly illustrate relevant features of the various implementations depicted.

The term "demagnetizing field" as applied to a magnetic medium refers to the field inside the magnetic medium whose source is the magnetization of the medium itself. This field extends outside the magnetic medium where it is commonly referred to as the "fringe field." However, it will be understood that these are just two different names for a single phenomenon. Inside the magnetic medium, the demagnetizing field opposes drive currents and grows significantly as the element size decreases. This is the reason for the large write currents necessary in conventional MTJ MRAM designs. The fringe field is essential in disk heads where it is used to write on the magnetic disk. However, it poses a significant problem in MRAM because the fringe field from one cell can change the bit value in a neighboring cell.

A saturated rectangular cell will have a sheet of poles on each end of the cell normal to the direction of magnetization. The near-field of $H_d$ will be constant at $2\pi M$, which for NiFe would be 5000 gauss, far in excess of the 2 Oe value for the film coercivity. Thus the ends will be demagnetized, spreading the poles over the end regions of the cell. In actuality M is likely to vary with position over the memory cell.

In open-flux structures, the demagnetizing field $H_d$ and the corresponding drive current become excessively large because the write current must provide a field that overcomes $H_d$. According to various embodiments of the invention, demagnetizing fields are reduced through the use of a keeper to promote closure and/or form a closed-flux structure. A keeper is a low-coercivity magnetic film whose magnetization results in boundary conditions that cancel the magnetic field in the plane of the film, thereby lowering the demagnetizing fields. According to specific embodiments, keepers serve two functions: reducing the demagnetizing field, and reducing the required drive current (this is apart from the issue of demagnetizing fields). For example cutting drive current in half reduces power consumption by a factor of four, and reduces the area required for selection electronics.

To investigate the dependence of the demagnetizing field $H_d$ on the relevant parameters of a keepered memory element such as the one shown in FIG. 1, the magnetization M was modeled as a function of position in cell, resulting in a representation of $H_d$ at the cell center as:

$$H_d = M_0 \cdot T \cdot \int_{-\frac{a}{2}}^{\frac{a}{2}} \int_{-\frac{L}{2}}^{\frac{L}{2}} \frac{-8}{L^2} \left[ \frac{x^2}{(x^2+y^2)^{\frac{3}{2}}} - \frac{x^2}{[x^2+y^2+(2\cdot g)^2]^{\frac{3}{2}}} \right] dx\, dy$$

where L is the cell length along the easy axis, a is the cell width along the hard axis, T is the total thickness of the magnetic layers (exclusive of intervening conductive, non-magnetic layers), g is the gap thickness between the cell and the keeper (i.e., the thickness of insulation 1), and $M_0$ is the maximum magnetization in the middle. It should be noted that $H_d$ vanishes for g=0.

Figure 2:
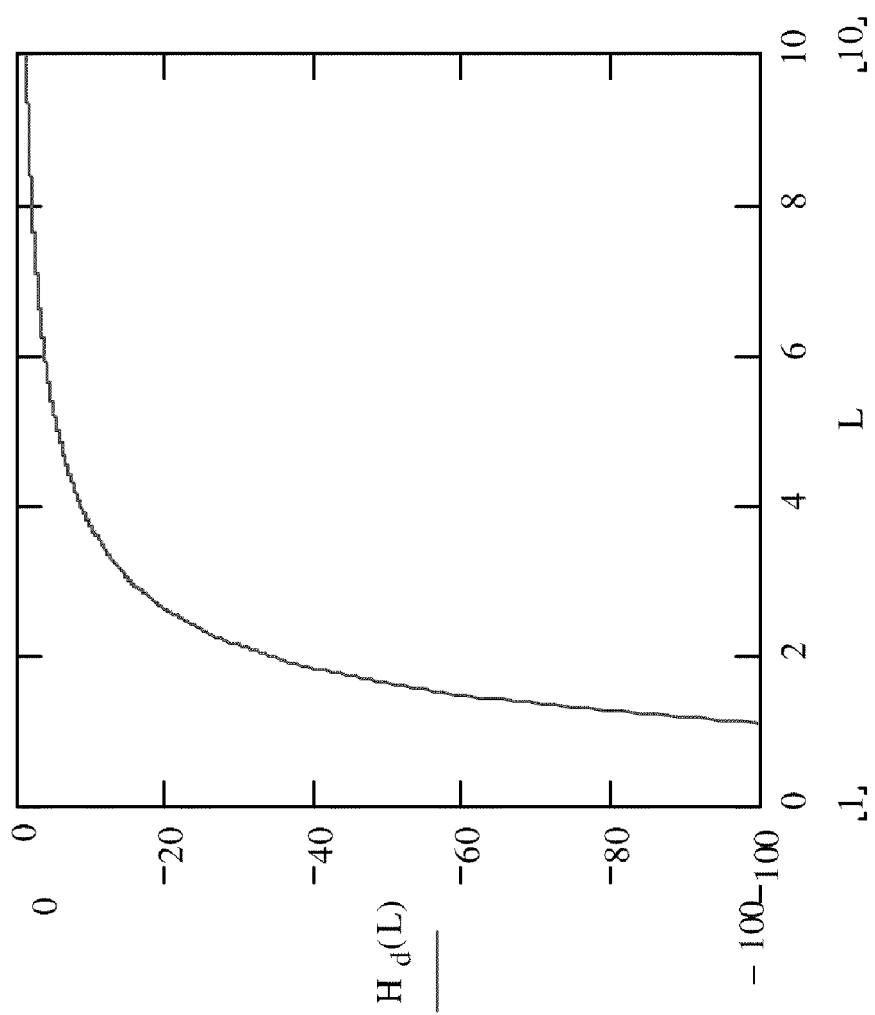
FIG. 2 is an example of a plot of demagnetizing field as a function of cell length.
Figure 3:
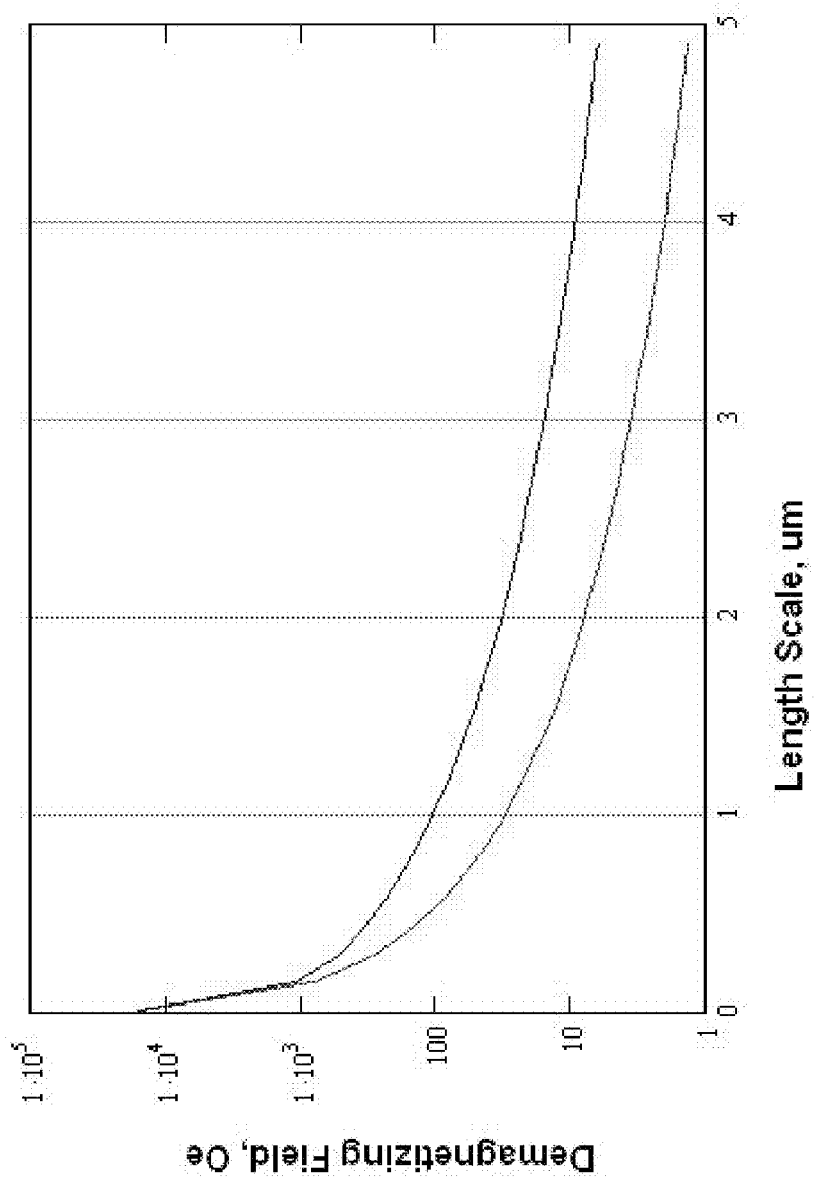
FIG. 3 is an example of a plot of demagnetizing field as a function of cell length for two different gap sizes.

This integral was numerically evaluated using Mathcad. A plot of the demagnetizing field as a function of the cell length for fixed values of the other parameters is shown FIG. 2. In this example, the demagnetizing field $H_d$ is in given in oe and L in μm. In addition, $M_0$=800 gauss, T=20 nm, g=0.1 μm, and a=1 μm. For a fixed aspect ratio (a/L), $H_d$ grows as the scale of the cell shrinks for fixed gap size. Therefore the demagnetizing field becomes unacceptably large as the cell size shrinks to nanoscale features. FIG. 3 shows the demagnetizing field for two gap sizes as a function of L (with L=3a); a gap of 20 nm (lower curve) and for a gap of 100 nm (upper curve); $M_0$=800 gauss and T=10 nm.

Figure 4:
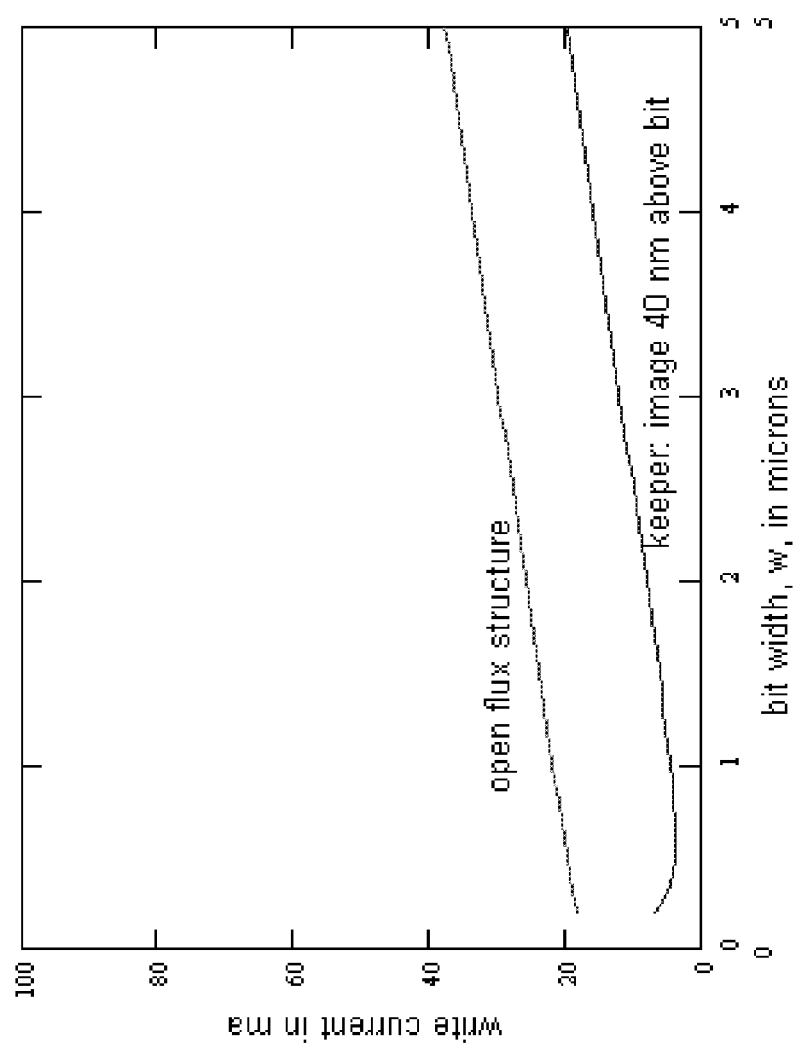
FIG. 4 is an example of a plot of theoretical write currents for an open-flux structure and a structure with a keeper.

Theoretical currents to write to a thin-film cell with $H_k$=25 oe for an open-flux structure and a structure with a keeper are compared in FIG. 4. As shown, a keeper which provides at least partial flux closure is effective at reducing the write current until the bit or cell width approaches the size of the gap.

Simulation results also indicate that the drive fields for a cell like the cell shown in FIG. 1 will get much larger as minimum feature size shrinks below about 1 μm, where there is a sharp rise in the demagnetizing field. Therefore, such cell designs become untenable at the deep submicron level. Therefore, according to specific embodiments of the invention, cell designs are provided in which the gap between the storage element(s) and the keeper is eliminated and, as a result, drive currents continue to decrease substantially linearly with cell width.

A particular class of embodiments based on GMR (giant magnetoresistance) thin-film elements will now be described. These embodiments employ thin-film structures exhibiting GMR and in which the magnetic layer that has higher coercivity (i.e., switches at relatively higher fields) is used for storage, and the magnetic layer that has lower coercivity (i.e., switches at relatively lower fields) is used for readout. The bit value is stored as a magnetization direction. The resistance of the element depends on the relative orientation of the magnetizations in the hard and soft layers. It will be understood that GMR elements suitable for use with such embodiments may have one of each type of magnetic layer separated by an intervening non-magnetic conductive layer, or multiple periods of such layers.

Figure 5:
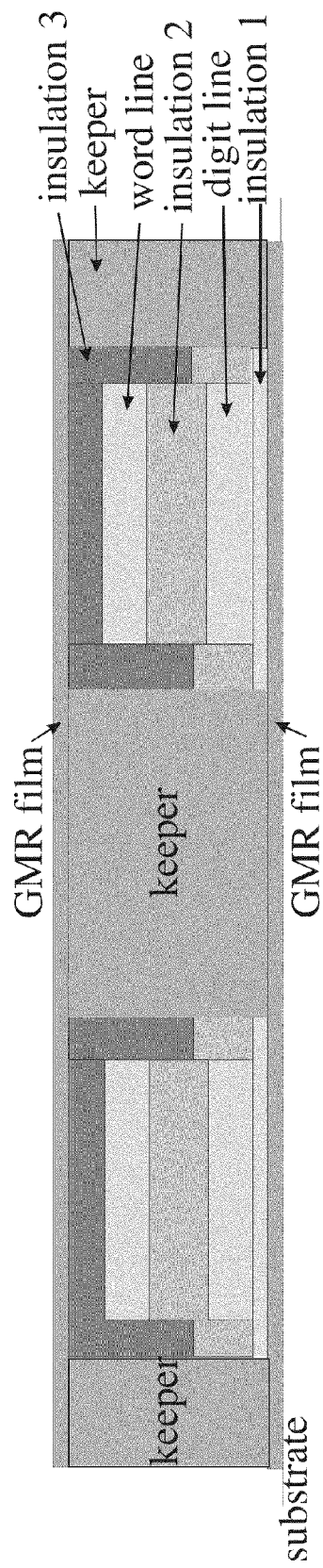
FIG. 5 is a simplified cross-section of a memory cell having a fully-closed-flux structure for use with various embodiments of the invention.
Figure 6:
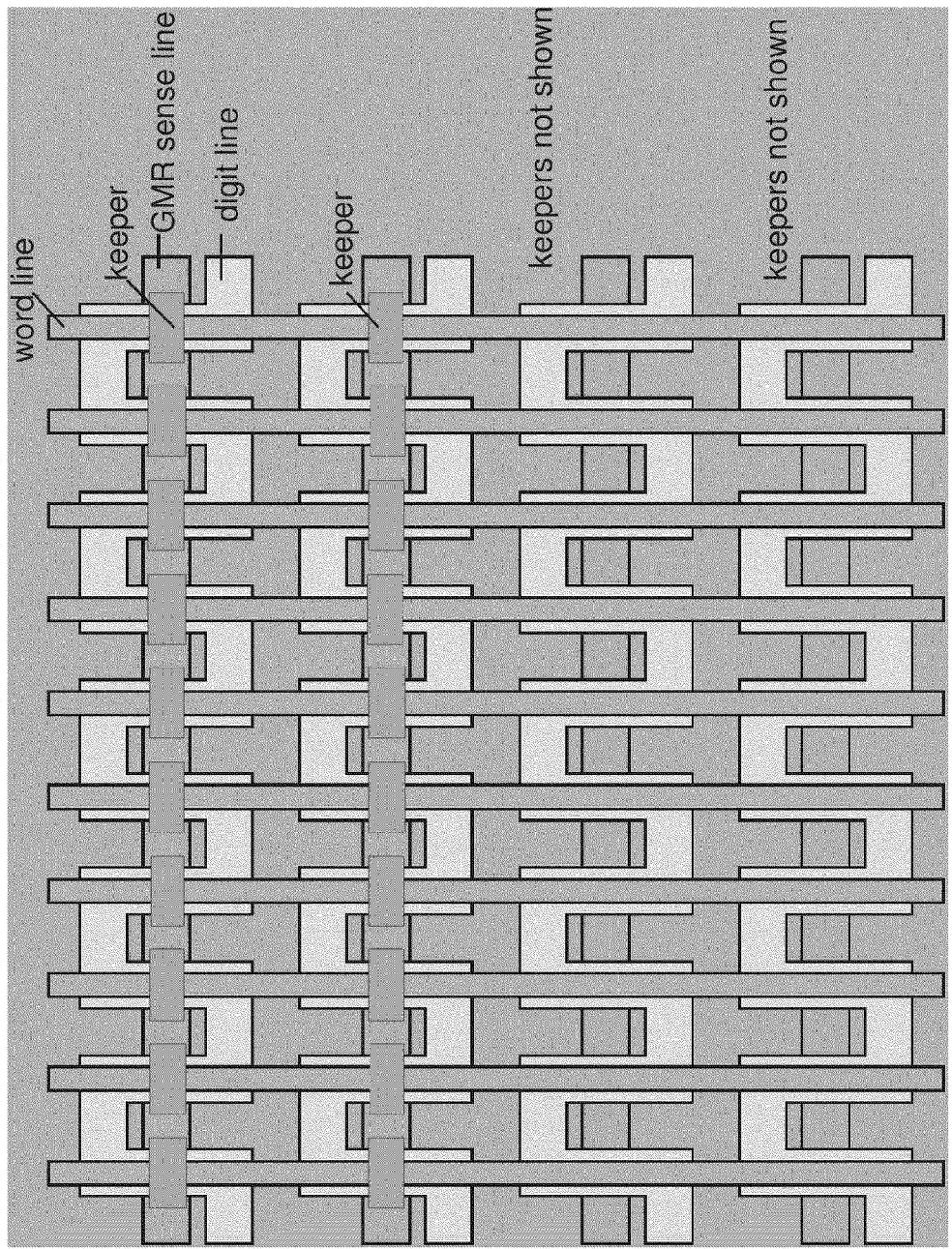
FIGS. 6-10 are simplified top views of memory arrays according to specific embodiments of the invention.

An example of a "gapless" cell design having a fully-closed-flux structure and designed in accordance with a specific embodiment of the invention is shown in FIG. 5. An array of such memory cells may be configured as shown in FIG. 6. In this configuration, individual cells are accessed by an array of intersecting drive (address) lines. Write is by a coincidence of two half-select currents applied to one of each intersecting drive line. Each half-select current supplies one-half of the field required to switch the hard (storage) layer. This type of architecture is typically referred to as a "cross-point" memory array. The cells of FIG. 6 reside in and are part of the GMR sense line. The cells are thus in series, though they are not physically distinct entities in the GMR elements, i.e., there is a continuous line. The active parts of the GMR line—the memory cells—are determined physically by the portions of the GMR line under the overlay of the straight lines and serpentine lines, where these drive lines are parallel. By way of example, the straight drive lines will be referred to as "word" lines and the serpentine drive lines as "digit" lines. However, it will be understood that these designation are arbitrary and therefore should not be used to limit the scope of the invention. Reading involves applying a full-select current pulse to one word line, of sufficient strength to switch the soft layers of all the cells in that column without switching any of the hard layers (nondestructive readout), but of less strength than a half-select current to switch the hard layer. A sense-line bias current produces a signal on the GMR line. For example, a full-select field to switch a cobalt (storage) layer may be 10 Oe, and a full-select field to switch a permalloy (readout) layer may be 2 Oe.

The depicted design uses parallel word and digit lines at the memory cells for a couple of reasons. The first is that it allows the keeper ends to be positioned closely to the GMR element so as to keep $H_d$ small. The second is that there is a cumulative disturb mechanism (also referred to as magnetization creep) caused by a combination of a pulsed hard-axis field together with an easy-axis field that is on while the hard-axis field is changing. This form of disturb, in which the cells themselves become demagnetized so their information contents are lost, is avoided by this design which uses only easy-axis fields. It should be noted that arrays of memory cells taking advantage of this "easy-axis" configuration are not limited to the configuration illustrated in FIG. 5. For example, the memory cells shown in FIGS. 1 and 11-16 may be arranged in similar configurations.

The memory cell of FIG. 5 has a fully-closed-flux structure, as a result of which, the field required to switch a bit should remain constant as cell size decreases. That is, experimental evidence of mitigation of the disturb problem strongly suggests that drive currents will scale with decreasing feature size because of the common physical origin of the two problems, i.e., the demagnetizing field. Microamp drive currents at nanoscale feature sizes are expected, and cell size near the theoretical limit of a crosspoint memory array, i.e., a memory accessed by an intersecting array of address lines, should be achievable. This is an order of magnitude smaller than that of a typical MTJ MRAM cell.

The Maxwell equation $\nabla \times H = J_{free}$ (SI units) implies that the field from a current in a wire is $H = \frac{1}{2} I/(a+T)$, where the line width and layer thickness are in meters and I is the current in amperes. The field produced in a stripline is thus proportional to the drive current and inversely proportional to the feature size (for $T \ll a$). The required switching fields are independent of feature size provided there are no demagnetizing fields. Write current should thus scale in proportion to the line width in the absence of demagnetizing fields.

Specific embodiments of the invention provide protection against external magnetic fields in multiple ways. As described above, a keeper may be employed to keep external fields from entering the structure over which the keeper is placed. In the presence of an external magnetic field, whether stray or applied, the magnetization in the keeper changes to a configuration whose poles create a magnetic field equal and opposite to the external field and functions to neutralize its entry into the keeper-protected structure.

In addition, and according to some embodiments, conetic magnetic shielding that protects the whole chip may be provided. Such shielding has long been used by the military to protect magnetic thin-film memories in submarines, planes, and missiles.

Various geometries for arranging memory cells such as various ones of those shown in FIGS. 1, 5, and 11-16 will now be described with reference to FIGS. 7-9. The first two are based on the use of a permalloy keeper. Permalloy is a conductive metal alloy that requires insulation between the keeper and the magnetoresistive element to prevent shorting (e.g., the cell of FIG. 1). The denser, third geometry is enabled by the use of a gapless design with a non-conductive keeper (e.g., the cell of FIG. 5).

Figure 7:
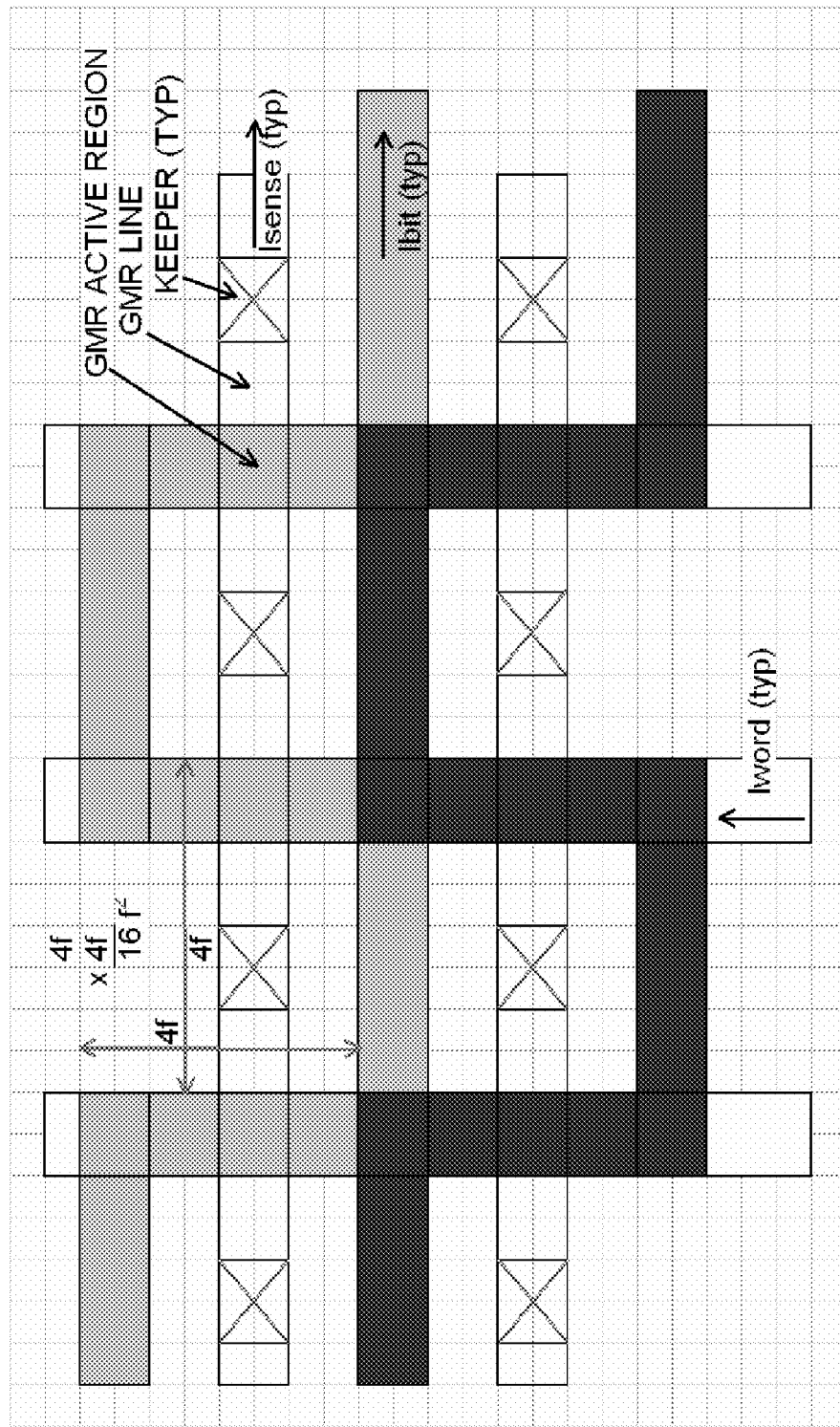

The first geometry, illustrated in FIG. 7, assumes a conservative spacing requirement of one minimum feature size—f—resulting in a cell area of approximately $16f^2$. The bit lines are overlapped (but insulated) serpentine conductors, as shown in the light and dark shades of gray. The word lines are vertical striplines, shown in white, but partially obscured by the bit lines in the drawing. The GMR lines (also used as sense lines), are horizontal striplines as shown. The keepers are indicated by the Xs.

Figure 8:
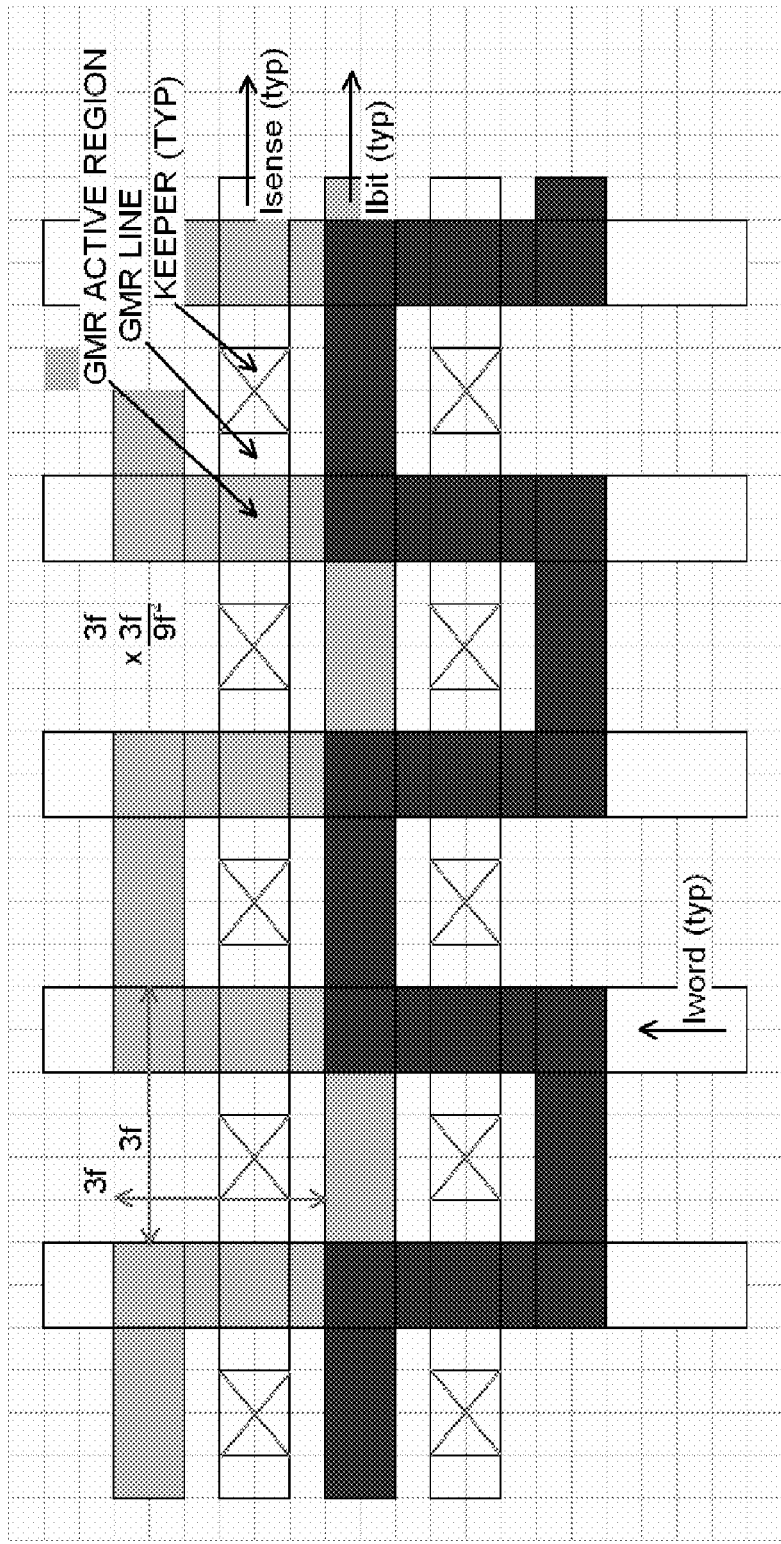

The second geometry, illustrated in FIG. 8, assumes that features fabricated on different layers can be spaced more closely; a common practice in older semiconductor processes. In this example, the distance between features formed on different layers is assumed to be f/2. A thinner insulation for the conductive keepers results in a cell area of approximately $9f^2$.

Figure 9:
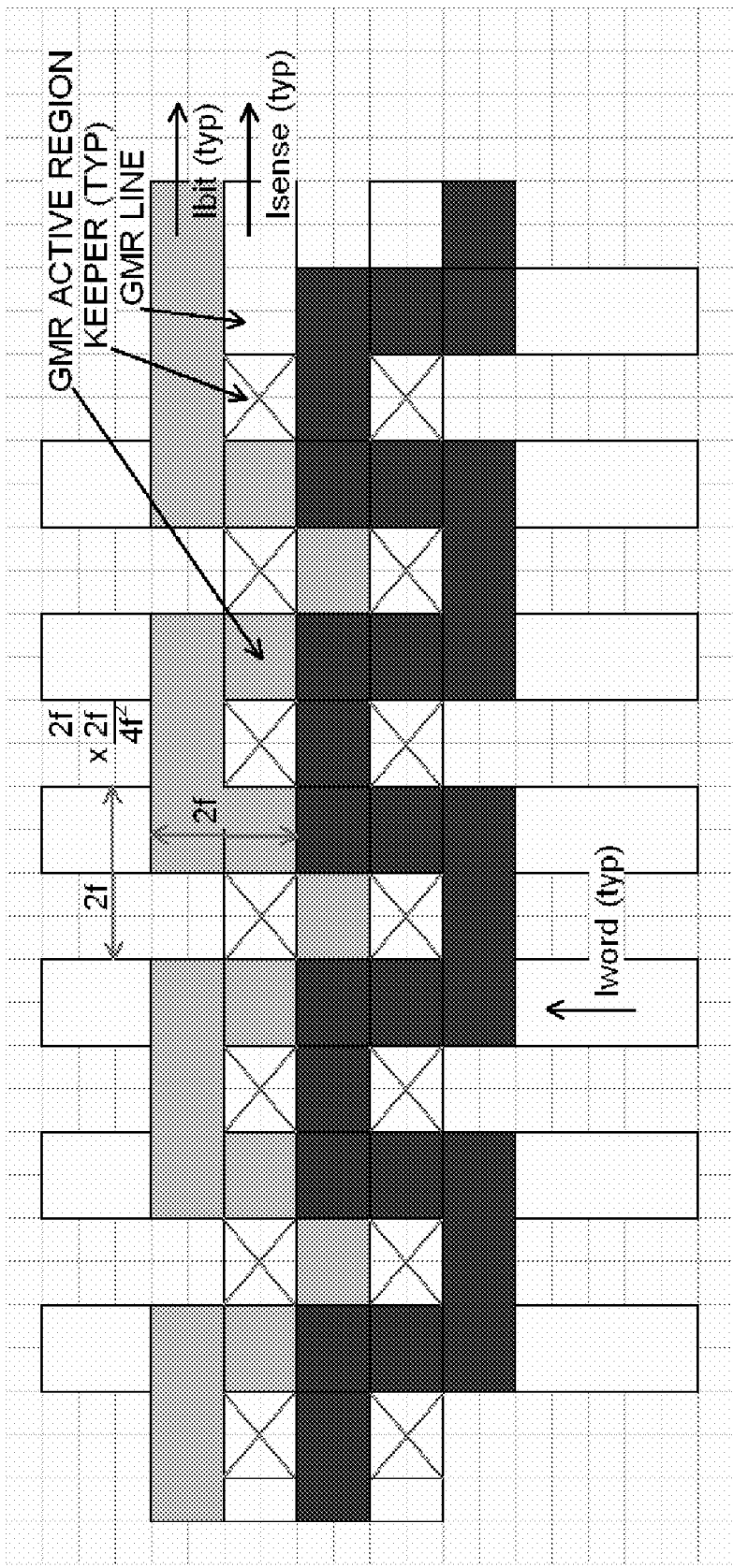

The cell in the third geometry, illustrated in FIG. 9, employs a non-conductive magnetic keeper material. This eliminates the need for a separate insulation layer, resulting in a cell area of approximately $4f^2$, the theoretical limit for a single-bit cell.

Ferrites are a class of magnetic materials that are also insulators. There was a large and fairly successful effort in the recording-disk industry some years ago to make ferrite-coated disks for hard drives. This effort focused on high-coercivity materials. The keeper in the $4f^2$ cells of FIG. 9 comprises a material with low coercivity and high permeability. Amorphous ferrite films are an example of materials suitable for use as a keeper in such implementations. As with the previously described examples of array geometries, the bit lines are overlapped (but insulated) serpentine conductors, shown in the light and dark shades of gray. The word lines are vertical striplines, shown in white, but partially obscured by the bit lines. The GMR lines (also used as sense lines) are horizontal striplines (also white) under the keepers, but are also partially obscured. The keepers are again indicated by the Xs.

More generally, there exists a wide range of suitable materials which may be used to implement a keeper in accordance with various embodiments of the invention. And new materials which may be suitable are constantly being developed. The number of suitable materials is such that a comprehensive listing here is not practicable. However, some suitable classes of materials are provided by way of example.

One example of a class of suitable materials is ferrites having a Spinel structure, e.g., $MO-Fe_2O_3$ where M is a divalent metal such as Mn, Fe, Co, Ni, Cu, Mg, or Li. Mixtures of these ferrites may also be used. Another example of a class of suitable materials is corundum-type oxides, e.g., hematite (alpha $Fe_2O_3$), ilmenite ($FeTiO_3$). Also $MTiO-Fe_2O_3$ where M may be Co, Ni, or Mn. Magnetoplumbite oxides, e.g., $MO-6Fe_2O_3$ where M is one of the large divalent ions Ba, Sr, or Pb, may also be employed. Yet another class of materials which may be used is pervoskite oxides, e.g., $MFeO_3$ where M is one of La, Ca, Ba, or St. Other series such as $MMnO_3$ and $MCoO_3$ may also be suitable. Ferrimagnetic garnets, e.g., $3M_2O_3-5Fe_2O_3$ where M is one of the trivalent atoms Sm, Eu, Gd, Tb, Dy, Ho, Er, Tm, Yb, Lu, or Y, may also be used. In addition, mixtures of any of these and other suitable materials may be used.

Additional information regarding materials which may be suitable for implementing keepers for use with embodiments of the invention may be found in section 5.3 of the textbook *Physics of Magnetism* by Sōshin Chikazumi, John Wiley &

Sons (1964), entitled "Ferrimagnetic Oxides and Compounds," the entirety of which is incorporated herein by reference for all purposes. In addition, new materials such as $M_3Me_2Fe_{24}O_{41}$ wherein M is an alkaline earth metal ion and Me is a divalent metal, may be used.

Figure 10:
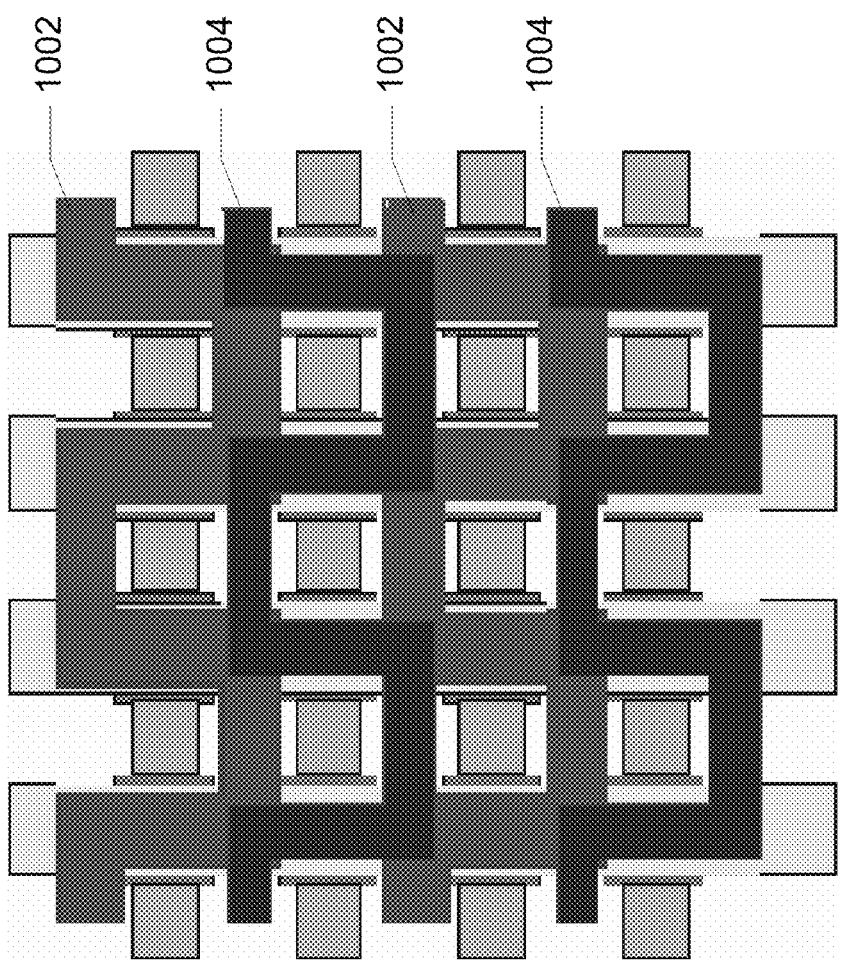

According to a specific embodiment, the cell area can be reduced to $4f^2$ by fabricating alternating digit lines in two separate deposition and patterning steps and by using an insulating keeper material. A plan view of such an array showing overlapping digit lines is shown in FIG. 10. The two separately deposited sets of serpentine digit lines 1002 and 1004, shown in the two darker shades of gray, are insulated from each other. There are no GMR elements under the overlap of the serpentine lines so the overlap does not cause disturb. The keeper layers are not shown for clarity. In addition, the drawing is not to scale, e.g., the digit lines are shown narrower than they are in actuality for clarity.

Figure 11:
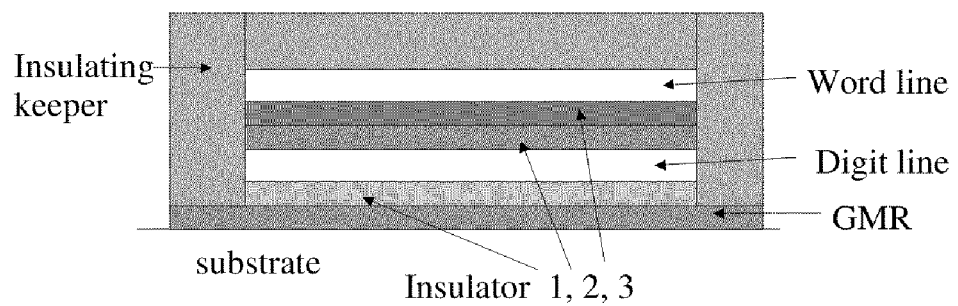
FIGS. 11 and 12 are simplified cross-sections of memory cells having fully-closed-flux structures for use with various embodiments of the invention.
Figure 11:
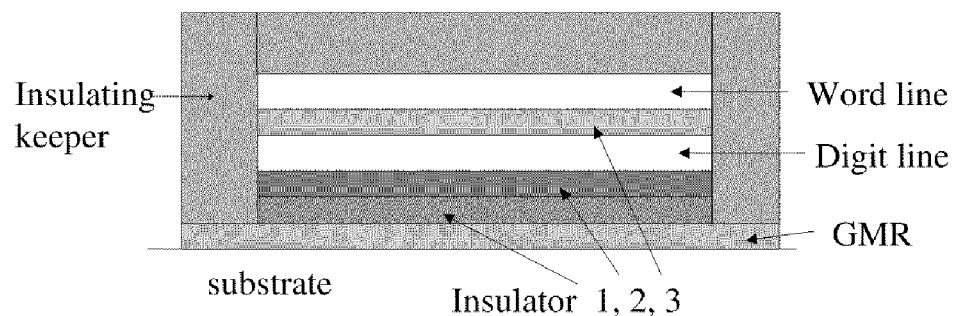

The two sets of separately deposited serpentine digit lines are insulated from each other, from the word lines, and from the GMR elements. Thus, there are three insulating layers. The sequence of the various layers in a cross section of the array shown in FIG. 10 depends on where in the array the cross section is taken. FIG. 11 shows two cross sections through the centers of two types of a gapless $4f^2$ cell design for use with various embodiments of the invention, each of which includes only one GMR element. In FIG. 11(a) the digit line is closer to the GMR element, and insulators 2 and 3 are contiguous. In FIG. 11(b) the digit line is closer to the word line, and insulators 1 and 2 are contiguous. According to a particular implementation, bits along a given digit line are all of one type, and those in the neighboring digit line of the other type. The keeper, being an insulator, contacts the GMR layer, as well as the two drive lines, resulting in a fully-closed-flux structure for each cell.

Figure 12:
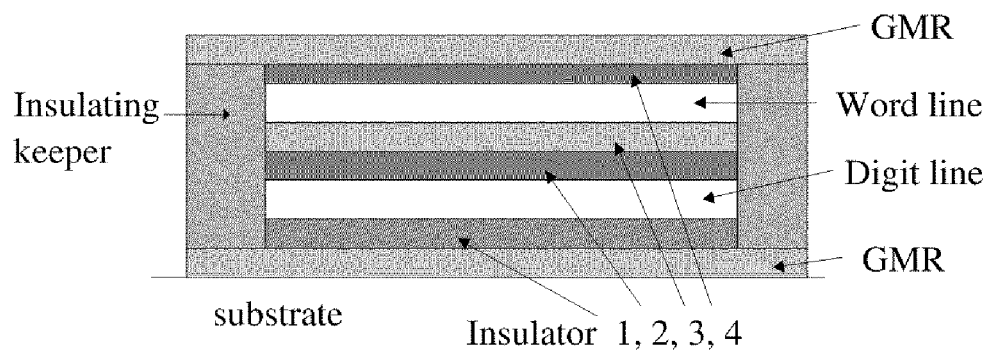
Figure 12:
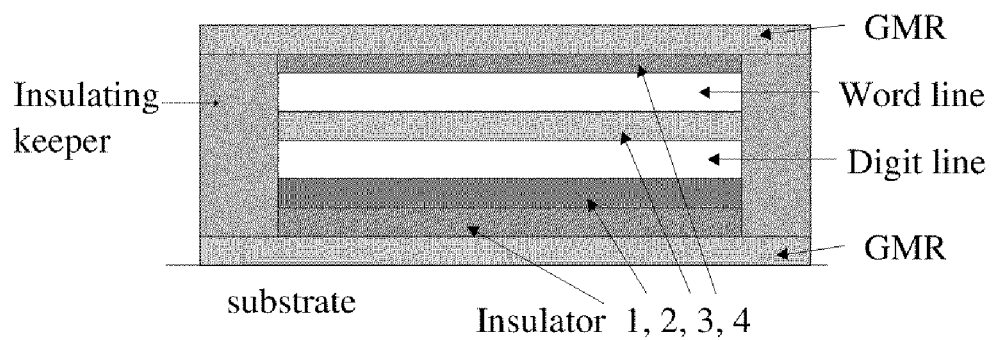

Alternative $4f^2$ designs for use with various embodiments of the invention, and including overlapping digit lines, an insulating keeper, and two GMR elements (e.g., similar to the design of FIG. 5) are shown in FIG. 12. In FIG. 12(a), the digit line is closer to the GMR film element, and insulators 2 and 3 are contiguous. In FIG. 12(b), the digit line is closer to the word line, and insulators 1 and 2 are contiguous.

In these implementations, the data stored in the top and bottom GMR elements are identical, i.e., each bit value is stored in two different locations in a given cell. The two thin-film structures can be connected in series to get twice the resistance, and therefore twice the signal can be achieved relative to the cell designs of FIG. 11. And because noise depends on the square root of R, the cells of FIG. 12 are also operationally superior to those of FIG. 11 in this regard for relatively little added processing complexity. Thus, the GMR elements can be connected in series to double the sense signal, with the noise increasing only by 2.5.

Specific embodiments have been described above which employ GMR thin-film elements as the basis for memory cells having fully-closed-flux structures. It should be noted that the invention is not so limited. According to a specific class of embodiments, memory cells and arrays employing MTJ elements having closed-flux configurations are contemplated.

According to specific embodiments, memory cell and array configurations similar to those described above are provided in which the GMR thin-film elements are replaced with an MTJ element (also referred to as a "tunneling pair"). According to one implementation, each sense line is implemented as pair of sense lines, and the sensing is done in parallel (instead of in series) due to the resistance of the tunneling junction.

Figure 13:
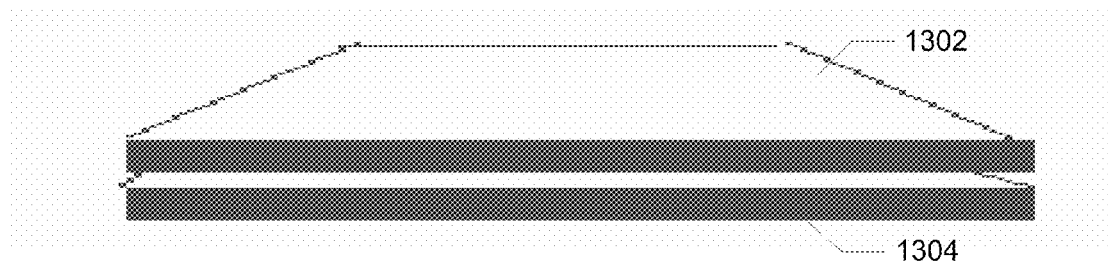
FIGS. 13-16 are simplified views of various aspects of memory cells having fully-closed-flux structures for use with various embodiments of the invention.
Figure 14:
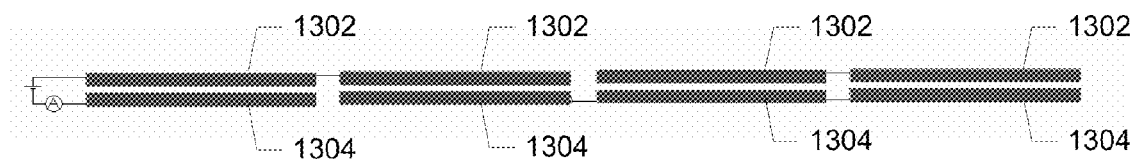

The tunneling pair may be implemented as a pair of magnetic films 1302 and 1304 separated by an insulating gap as shown in FIG. 13. The two magnetic films are electrically connected by virtue of electrons tunneling through the intervening insulator. The resistance of the insulator is either large or small depending on whether the directions of magnetization of the two films are antiparallel or parallel. As shown in FIG. 14, the MTJ elements may be connected to each other in parallel, i.e., top film to top film, bottom film to bottom film, to form a pair of sense lines.

Figure 15:
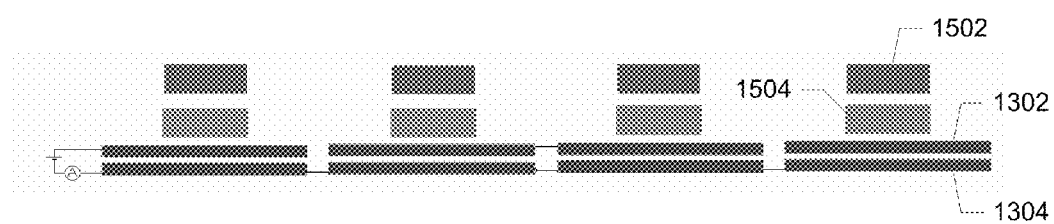
Figure 16:
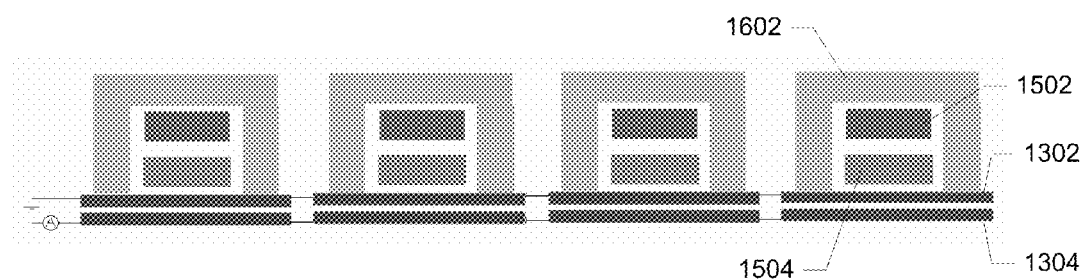

A particular MTJ element may be sensed when the magnetization of one of the element's films is toggled back and forth, thereby switching the resistance between one of the pairs of bits. This may be done with word and digit lines 1502 and 1504 placed on top of the MTJ elements as shown in FIG. 15. As discussed above, the word and digit lines may be parallel in the region of each MTJ element as described above with reference to FIG. 6 to achieve similar benefits. And as shown in FIG. 16, a keeper structure 1602 is provided over and in direct contact with each MTJ element, thus providing a fully-closed-flux structure which eliminates demagnetizing fields.

It should be noted that, although a fully-closed-flux design may be implemented using MTJ elements, arrays of such memory cells may not be suitable for the small scales which can be achieved by GMR-based implementations in that instability due to thermal effects may present obstacles at such scales.

For additional details on memory cell and array architectures based on quantum magnetoresistance (QMR) (which includes GMR and MTJ structures) and related techniques which may be employed with various embodiments of the invention to implement such cells, arrays, and architectures, reference can be made to U.S. Pat. Nos. 5,237,529; 5,592,413; and 5,587,943. In addition, computing systems may be implemented in which some or all of the various levels of the memory hierarchy, e.g., processor cache memory, system memory, long term storage, etc., are implemented using the techniques described herein.

Implementations are also contemplated in which not only the memory cells themselves, but associated electronics are implemented using "all-metal" general purpose electronics. Such all-metal memory chips are inherently radiation hard. For information on the implementation of "all-metal" general-purpose electronics which may be used to implement such memories and the systems of which they are a part, reference can be made to U.S. Pat. Nos. 5,929,636; 6,031,273; 6,469,927; and 6,483,740. The entire disclosure of each of the patents referenced in this and the preceding paragraph is incorporated herein by reference for all purposes.

As discussed above and in accordance with embodiments of the present invention, techniques are provided by which memory cell sizes near theoretical minimums are achievable. This enables memory architectures having high levels of information density. It should be noted that the techniques described herein may be combined with other techniques to achieve even greater density. For example, implementations are contemplated in which individual memory cells store multiple bits of information using, for example, techniques described in U.S. Pat. No. 6,594,175, the entire disclosure of which is incorporated herein by reference. In another example, multiple levels of memory arrays and associated electronics configured in 3 dimensions may be fabricated to achieve greater density as described in U.S. Pat. No. 6,992,919, the entire disclosure of which is incorporated herein by reference.

In addition, future advances in lithography will make possible the fabrication of memory elements with ever decreasing horizontal or in-plane dimensions. This area miniaturization brings exciting opportunities as well as a variety of challenges to various next-generation magnetic RAM designs.

One such opportunity relates to CPP (Current Perpendicular to the Plane) memory elements based on giant magnetoresistance (GMR). In these elements the sense current flows vertically through the element rather than flowing horizontally as with CIP (current in plane) elements. This is known to yield a higher value of GMR under suitable conditions. One problem associated with CPP elements is that GMR films having a thickness much smaller than the horizontal dimensions result in an unacceptably low element resistance for current flowing vertically, thereby making it difficult to sense. Therefore, according to a particular class of embodiments, CPP memory elements are provided which address this issue, providing yet another mechanism that enables greater information density. According to such embodiments, CPP elements are provided which are much thicker than they are wide, as a result of which the resistance becomes reasonable.

Another challenge with increasing miniaturization is that the total volume of the memory elements may get so small as to decrease their thermal stability to an unacceptable level. That is, for a sufficiently small particle, thermal energy (kT) at room temperature becomes sufficiently large that the particle's magnetization may become unstable (reverse spontaneously) with respect to thermal fluctuations. This is a relaxation phenomenon. The magnetization of an initially magnetized sample decays spontaneously according to $$M(t)=M_0\exp(-t/\tau)$$

where the relaxation time is given by $$\tau=\tau_0\exp\{KV/(kT)\}$$

with K the intrinsic magnetic anisotropy of the material, V the sample volume, and typically $\tau_0 \sim 10^{-9}$ s. For the information to remain stable for at least 10 years, it is desirable to have KV>40 kT. For typical materials, $K \sim 2.2 \times 10^5$ J/m$^3$, which implies a minimum sample volume of $\sim 10^3$ nm$^3$.

According to various embodiments of the invention, the vertical thickness of a CPP memory element is increased sufficiently as its width is decreased to maintain its mass or volume at the level required to ensure thermal stability for the specified time. An added benefit is that the increase in thickness can be realized by increasing the number of layers (i.e., multiple periods of the basic thin-film structure, which will further increase the GMR value and the signal. GMR values of experimental multi-period or lattice films have been found in the range around 100% at room temperature.

It should be noted that as these thicknesses are increased, the thickness of the nonmagnetic metal layer between the magnetic layers may also have to be increased in order to avoid exchange forces between the two layers increasing to the point where the lower-coercivity layer could not be switched independently. If this is the case, then this solution may not be as effective for MTJ-based memories in which the effectiveness of the tunnel layer is very sensitive to its thickness which is constrained to lie within very narrow limits in order to allow tunneling. However, as long as constraints on the tunneling layer may be met, the technique described herein may be used to implement such memory elements.

According to a particular class of implementations, in order to keep substantially constant mass or volume, the vertical thickness of the memory element is increased as the square of the decrease in horizontal feature size. So, for example, for a minimum feature size of about 6 nm and an aspect ratio of about unity, the thicknesses of individual layers in a two-layer GMR film, which may be about 8 nm each at micron-scale minimum feature size, will be increased to about 15 nm each. Alternatively, the overall increase in thickness can be realized by replacing the single GMR film by a multi-period structure with three periods, with the individual layer thicknesses maintained at about 8 nm. These two approaches may also be combined. According to a specific implementation, this is done for both the storage layer and the read layer as each of them may be separately vulnerable to thermal instability. As discussed above, this may also be done for the nonmagnetic layer between them.

It should be noted that this innovation may be combined with any of the other innovations described herein to achieve highly dense memory systems. Alternatively, the CPP memory elements described herein may be implemented without using any of the other techniques described herein.

While the invention has been particularly shown and described with reference to specific embodiments thereof, it will be understood by those skilled in the art that changes in the form and details of the disclosed embodiments may be made without departing from the spirit or scope of the invention. In addition, although various advantages, aspects, and objects of the present invention have been discussed herein with reference to various embodiments, it will be understood that the scope of the invention should not be limited by reference to such advantages, aspects, and objects. Rather, the scope of the invention should be determined with reference to the appended claims.

What is claimed is:

1. A memory, comprising an array of memory cells, each memory cell comprising:
a first multilayer thin-film storage element exhibiting magnetoresistance;
a first signal line above the first thin-film storage element and electrically isolated therefrom;
a second signal line above the first signal line, the second signal line being electrically isolated from both the first thin-film storage element and the first signal line; and
at least one non-conductive keeper element in direct contact with the first thin-film storage element;
wherein the first thin-film storage element and the keeper element form at least a portion of a fully-closed-flux structure.

2. The memory of claim 1 wherein each first thin-film storage element comprises one or more of a GMR element, an MTJ element, a CIP element, or a CPP element.

3. The memory of claim 1 wherein the memory cells in the array are arranged in a plurality of rows and a plurality of columns, wherein the first thin-film storage elements in each row of memory cells are part of a first continuous thin-film structure, wherein the first signal line for each memory cell is part of a first continuous drive line for the corresponding row of memory cells, wherein the second signal line for each memory cell is part of a second continuous drive line for the corresponding column of memory cells, and wherein one of the first drive lines and one of the second drive lines cross at each memory cell and are configured such that current directions associated with each are parallel at each memory cell.

4. The memory of claim 3 wherein each of the first drive lines is configured in a serpentine pattern, and wherein the first drive lines corresponding to adjacent rows of memory cells overlap.

5. The memory of claim 4 wherein the first drive lines corresponding to adjacent rows of memory cells overlap such that a cell area associated with each memory cell is $4f^2$, where f represents a lithography feature size.

6. The memory of claim 1 wherein the first thin-film storage element is configured to store one or more bits of information.

7. The memory of claim 1 wherein each memory cell further comprises a second multilayer thin-film storage element above and electrically isolated from the first and second signal lines, wherein the second thin-film storage element forms a portion of the fully closed-flux structure.

8. The memory of claim 7 wherein the second thin-film storage elements in each row of memory cells are part of a second continuous thin-film structure, and wherein the first and second continuous thin-film structures associated with each row of memory cells are electrically connected in parallel.

9. An electronic system comprising system memory, the system memory comprising a plurality of memory cells, each memory cell comprising:
 a multilayer thin-film storage element exhibiting magnetoresistance;
 a first signal line above the thin-film storage element and electrically isolated therefrom;
 a second signal line above the first signal line, the second signal line being electrically isolated from both the thin-film storage element and the first signal line; and
 at least one non-conductive keeper element in direct contact with the thin-film storage element;
 wherein the thin-film storage element and the keeper element form at least a portion of a fully-closed-flux structure.

10. The electronic system of claim 9 wherein the system memory is part of a memory hierarchy including cache memory associated with at least one processor, and long term storage, and wherein at least one other portion of the memory hierarchy comprises an additional array of memory cells having fully-closed-flux structures.

11. A memory cell comprising:
 a first multilayer thin-film storage element exhibiting magnetoresistance;
 a first signal line above the first thin-film storage element and electrically isolated therefrom;
 a second signal line above the first signal line, the second signal line being electrically isolated from both the first thin-film storage element and the first signal line; and
 at least one non-conductive keeper element in direct contact with the first thin-film storage element;
 wherein the first thin-film storage element and the keeper element form at least a portion of a fully-closed-flux structure.

12. The memory cell of claim 11 wherein the first thin-film storage element comprises one of a GMR element, an MTJ element, a CIP element, or a CPP element.

13. The memory cell of claim 11 wherein the first signal line and the second signal line are configured such that current directions associated with each are parallel.

14. The memory cell of claim 11 wherein the first thin-film storage element is configured to store one or more bits of information.

15. The memory cell of claim 11 further comprising a second multilayer thin-film storage element above and electrically isolated from the first and second signal lines, wherein the second thin-film storage element forms a portion of the fully closed-flux structure.

* * * * *